United States Patent [19]
Trefonas, III et al.

[11] Patent Number: 6,136,501
[45] Date of Patent: Oct. 24, 2000

[54] POLYMERS AND PHOTORESIST COMPOSITIONS COMPRISING SAME

[75] Inventors: Peter Trefonas, III, Medway; Gary N. Taylor, Northboro; George G. Barclay, Jefferson, all of Mass.

[73] Assignee: Shipley Company, L.L.C., Marlborough, Mass.

[21] Appl. No.: 09/143,462

[22] Filed: Aug. 28, 1998

[51] Int. Cl.$^7$ ..................................................... G03F 7/004
[52] U.S. Cl. .................................. 430/270.1; 430/285.1; 430/905; 430/910; 430/326; 430/325
[58] Field of Search ............................ 430/270.1, 281.1, 430/285.1, 287.1, 908, 910

[56] References Cited

U.S. PATENT DOCUMENTS

| | | | |
|---|---|---|---|
| 4,491,628 | 1/1985 | Ito et al. ................................. | 430/176 |
| 5,362,600 | 11/1994 | Sinta et al. ............................... | 430/192 |
| 5,492,793 | 2/1996 | Breyta et al. ....................... | 430/270.14 |
| 5,962,184 | 10/1999 | Allen et al. . | |
| 5,968,713 | 10/1999 | Nozaki et al. . | |

FOREIGN PATENT DOCUMENTS

| | | |
|---|---|---|
| 0 440 374 A2 | 8/1991 | European Pat. Off. . |
| 0 663 616 A2 | 7/1995 | European Pat. Off. . |
| 196 26 003 A1 | 6/1996 | Germany . |

*Primary Examiner*—John S. Chu
*Assistant Examiner*—Yvette M Clarke
*Attorney, Agent, or Firm*—Peter F. Corless; Darryl P. Frickey; S. Matthew Cairns

[57] ABSTRACT

The present invention provides novel polymers and photoresist compositions that comprise the polymers as a resin binder component. The photoresist compositions of the invention can provide highly resolved relief images upon exposure to short wavelengths, including 193 nm and 248 nm. The resists of the invention are also useful or imaging at other wavelengths such as 365 nm. Polymers of the invention include those that comprise a photogenerated acid-labile unit that is ester group that comprises an alkyl moiety having about 5 or more carbon atoms and at least two secondary, tertiary or quaternary carbon atoms. The alkyl moiety of the ester group can be a noncyclic or single ring alicyclic group. The carboxyl ($C=O(O)$) oxygen of the ester group is often preferably directly bonded to a quaternary carbon atom.

30 Claims, No Drawings

POLYMERS AND PHOTORESIST COMPOSITIONS COMPRISING SAME

BACKGROUND OF THE INVENTION

1. Field of the Invention

The present invention relates to new polymers and use of such polymers as a resin binder component for photoresist compositions, particularly chemically-amplified positive-acting resists that can be effectively imaged at short wavelengths such as 248 nm and 193 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes,* McGraw Hill Book Company, New York, ch. 2, 1975 and by Moreau, *Semiconductor Lithography, Principles, Practices and Materials,* Plenum Press, New York, ch. 2 and 4, both incorporated herein by reference for their teaching of photoresist compositions and methods of making and using the same.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., *Proceedings of SPIE,* 2724:334–343 (1996); and P. Trefonas et al. *Proceedings of the 11$^{th}$ International Conference on Photopolymers (Soc. Of Plastics Engineers),* pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). Use of such short exposure wavelengths can enable formation of smaller features. Accordingly, photoresist teat yields well-resolved images upon 248 nm or 193 nm exposure could enable formation of extremely small (e.g. sub-0.25 $\mu$m) features that respond to constant industry demands for smaller dimension circuit patterns, e.g. to provide greater circuit density and enhanced device performance.

However, many current photoresists are generally designed for imaging at relatively higher wavelengths, such as I-line (365 nm) and G-line (436 nm) exposures and are generally unsuitable for imaging at short wavelengths such as 193 nm and 248 nm. In particular, prior resists exhibit poor resolution (if an image at all can be developed) upon exposure to these shorter wavelengths. Among other things, current photoresists can be highly opaque to extremely short exposure wavelength such as 248 nm and 193 nm, thereby resulting in poorly resolved images. Efforts to enhance transparency for short wavelength exposure can negatively impact other important performance properties such as substrate adhesion, which in turn can dramatically compromise image resolution.

It thus would be desirable to have new photoresist compositions, particularly resist compositions that can be imaged at short wavelengths such as 248 nm and 193 nm. It would be particularly desirable to have such resist compositions that can provide high resolution relief images, particularly small features such as sub-0.25 $\mu$m images.

SUMMARY OF THE INVENTION

The present invention provides novel polymer and photoresist compositions that comprise the polymers as a resin binder component.

The photoresist compositions of the invention can provide highly resolved relief images upon exposure to extremely short wavelengths, particularly 248 mn and 193 nm. The photoresists of the invention preferably are chemically-amplified positive resists, which utilize photoacid-induced cleavage of pendant alkyl ester polymer groups to provide solubility differentials between exposed and unexposed areas of a resist coating layer.

In general, polymers of the invention comprise one or more ester repeat units where the ester group comprises an optionally substituted alkyl moiety having about 5 or more carbon atoms, with at least two branched carbon atoms, i.e. at least two secondary, tertiary or quaternary carbon atoms. The alkyl moiety can be a noncyclic or single ring alicyclic group. Suitable alkyl moieties include those that have one, two or more tertiary carbon atoms, and/or one, two or more quaternary carbons. References herein to a "secondary" carbon indicate the carbon atom has two non-hydrogen substituents (i.e. $\underline{C}H_2RR^1$ where R and $R^1$ are the same or different and each is other than hydrogen); references herein to a "tertiary" carbon indicate the carbon atom has three non-hydrogen substituents (i.e. $\underline{C}HRR^1R^2$ where R, $R^1$ and $R^2$ are the same or different and each is other than hydrogen); and references herein to a "quaternary" carbon indicate the carbon atom has four non-hydrogen substituents (i.e. $\underline{C}RR^1R^2R^3$ where R, $R^1$, $R^2$ and $R^3$ are each the same or different and each is other than hydrogen). See, for instance, Morrison and Boyd, *Organic Chemistry*, particularly at page 85 ($3^{rd}$ ed., Allyn and Bacon), for a discussion of those terms secondary, tertiary and quaternary. It also should be understood that references herein to "alkyl" are inclusive of linked or branched carbon chains such as alkylidene, alkylene and the like. Additionally, for purposes of the present disclosure, the keto carbon (i.e. $C=\underline{O}$) of the ester linkage is referred to herein as the "carbonyl oxygen", and the linked oxygen (i.e. $C=\underline{O}$)) is referred to herein as the "carboxyl oxygen", such as indicated by the following illustrative structure where the above terms are exemplified:

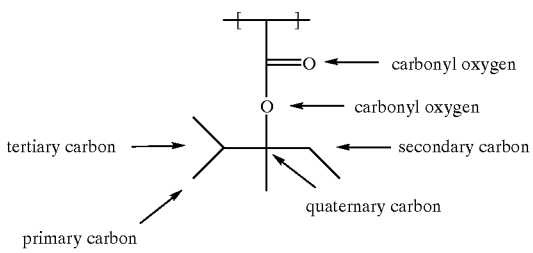

It is often preferred that a quaternary carbon is directly linked (i.e. covalently linked with no other interpose atoms) to the ester carboxyl oxygen, as is depicted in the above structure.

It has been found that chemically-amplified positive photoresists comprising a polymer of the invention can provide excellent lithographic results, including 0.15 μm resolution with 193 nm exposure at 20 mJ/cm². See the results-set forth in the examples which follow. Without being bound by theory, it is believed that the relatively large steric size of the leaving group can impart high dissolution contrast upon loss of the leaving group, and that the presence of a second branch point can reduce the recombination rate of the leaving group, thereby increasing photospeed and/or reducing processing temperature (i.e. post-exposure bake temperatures).

Preferred alkyl ester groups of polymers of the invention contain only saturated carbon atoms. Thus, e.g., in this preferred aspect of the invention, the groups R, $R^1$, $R^2$, $R^3$ of the above formulae for secondary, tertiary and quaternary carbons of alkyl ester groups (i.e. the formulae $CH_2RR^1$, $CHRR^1R^2$, $CRR^1R^2R^3$) are each saturated alkyl, typically $C_{1-10}$ alkyl, more typically $C_{1-6}$ alkyl, still more typically alkyl having 1, 2, 3 or 4 carbons.

Preferred alkyl moieties include those having 1 quaternary carbon linked to the carboxyl oxygen atom of the ester monomer and $\geq 1$ additional tertiary or quaternary carbon atoms and not more than a one single ring alicyclic group. Additional preferred alkyl moieties include those having 1 quaternary carbon linked to the carboxyl oxygen atom of the ester monomer and $\geq 1$ additional secondary carbon atoms and no more than one ring alicyclic groups. Optimally, the ester group will contain only carbon and hydrogen atoms and be free of double or triple bonds.

More preferred alkyl moieties include those having one quaternary carbon linked to the carboxyl oxygen atom of the ester monomer and $\geq 1$ additional quaternary or tertiary carbon atoms and not more than a one single ring alicyclic group, although other groups also will be preferred such as 2,2,3,4,4-pentamethyl-3-pentyl methacrylate {or 2,2,3,4,4-pentamethyl-3-pentyl acrylate} and 2,3,4-trimethyl-3-pentyl methacrylate {or 2,3,4-trimethyl-3-pentyl acrylate}. Optimally, the ester group will contain solely carbon and hydrogen atoms and be free of double or triple bonds.

As mentioned, alicyclic alkyl moieties of polymer ester units contain only a single ring without any bridge group or other joined rings. The terms "single ring cyclic alkyl", "single ring alkyl" or other similar term as used herein specifically excludes bridged or other joined ring groups such as adamantyl, norbomyl, etc. Preferred single ring alkyl moieties of ester units include cyclopentyl, cyclohexyl, cycloheptyl and cyclooctyl, all of which may have one, two, three or more ring carbons optionally substituted, particularly by non-cyclic alkyl, such as $C_{1-6}$ alkyl, more preferably $C_{1-6}$ alkyl. One and/or two methyl are particularly preferred substituents of an alicyclic ring carbon.

Preferably, alkyl ester units of polymers of the invention are pendant from the polymer backbone, more preferably directly pendant from the polymer backbone, i.e. where no phenyl, alkylene or other spacer group is interposed between the polymer backbone (the backbone preferably being an optionally substituted alkylene linkage) and the carbonyl moiety of the alkyl ester. Such directly pendant esters are suitably provided by condensation of vinyl esters, particularly alkylesters of acrylic acid, methacrylic acid and the like.

However, although generally less preferred, polymers are also provided where a spacer group is interposed between the polymer backbone and the alkyl ester group. For a suitable spacer group will be a pendant carbocyclic hydroxy group, particularly a phenolic unit, and where the alkylester is grafted onto the hydroxy group. Other suitable spacer units include e.g. alkylene groups, such as $C_{2-8}$ alkylene.

Polymers of the invention may contain units in addition to the alkyl esters units described above. For example, polymers may contain additional photoacid-labile groups such as pendant esters such as those of the formula $-WC(=O)OR^5$, wherein W is a linker such as a chemical bond, an alkylene particularly $C_{1-3}$ alkylene, or carbocyclic aryl such as phenyl, or aryloxy such as phenoxy, and $R^5$ is a suitable ester moiety such as an optionally substituted alkyl (including cycloalkyl) suitably having from 1 to about 20 carbons, more preferably about 4 to about 12 carbons, but without a noncyclic or single ring alkyl group having 5 or more carbons and two or more secondary, tertiary or quaternary carbons; optionally substituted alkenyl (including cycloalkenyl) group suitably having from 2 to about 20 carbons, more preferably about 4 to about 12 carbons; optionally substituted alkynyl group suitably having from 2 to about 20 carbons, more preferably about 4 to about 12 carbons; optionally substituted alkoxy group suitably having from 1 to about 20 carbons, more preferably 2 to about 12 carbons; or a heteroalicyclic group that contains one or more N, O or S atoms and one or more rings having from 4 to about 8 ring members such as tetrahydrofuranyl, thienyl, tetrahydropyranyl, morpholino and the like. Specifically preferred $R^5$ groups include e.g. t-butyl, tetrahydropyran, ethoxyethyl, or an alicyclic group including bridged groups such as such as adamantyl including 2-methyl-2-adamantyl, norbomyl, isobomyl and the like.

Polymers of the invention optionally may contain other groups that contribute to aqueous developability of a photoresist. For example, preferred polymer groups that contribute to aqueous developability contain carboxy or hydroxy moieties such as may be provided by condensation of vinylaryl such as vinylphenol which may be provided by condensation of vinylphenol, acrylic acid, methacrylic acid, 2-hydroxyethylmethacrylate, or other hydrophilic monomers.

Other optional polymer units include those that may be provided by condensation of a vinyl alicyclic group, e.g. 2-adamantyl-2-methyl methacrylate, isobornyl methacrylate and the like, or a non-cyclic alkyl group such as t-butyl methacrylate and the like, or a vinyl nitrile such as condensation of methacrylonitrile to provide pendant cyano groups. Pendant cyano, acid (COOH), and/or alicyclic groups, such as those mentioned above, are generally preferred additional units of polymers of the invention.

For use in photoresists to be imaged at 193 nm, preferably a polymer of the invention will be substantially free of any phenyl or other aromatic groups. For example, preferred polymers contain less than about 5 mole percent aromatic groups, more preferably less than about 1 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention. Other aspects of the invention are disclosed infra.

DETAILED DESCRIPTION OF THE INVENTION

As stated above, polymers of the invention comprise one or more ester repeat units where the ester group comprises an optionally substituted noncyclic or single ring alkyl moiety having about 5 or more carbon atoms, with at least two branched carbon atoms, i.e. at least two secondary, tertiary or quaternary carbon atoms.

In addition to the preferred polymers discussed above, preferred polymers of the invention include those that comprise repeat units of the following Formula I:

I wherein W is a linker as discussed above, e.g. a chemical bond, an alkylene particularly $C_{1-3}$ alkylene, or carbocyclic aryl such as phenyl, or aryloxy such as phenoxy (where the ester group is grafted onto pendant phenolic groups);

R is an alkyl group as discussed above that has 5 or more carbon atoms, with at least two branched carbon atoms, i.e. at least two secondary, tertiary or quaternary carbon atoms; and Z is a bridge group between monomer units of the polymer, e.g. reactive moieties of monomer units such as carbon-carbon double bonds that are polymerized to provide e.g. optionally substituted alkylene, preferably $C_{1-3}$ alkylene optionally substituted by $C_{1-4}$ alkyl.

As discussed above, preferred polymers of the invention include ester units provided by acrylic ester condensation, including polymers that comprise repeat units of the following Formula II:

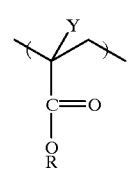

II wherein R is the same as defined above for Formula I; and
Y is hydrogen or $C_{1-6}$ alkyl, with methyl being preferred.

Specifically preferred ester repeat units of polymers of the invention include those of the following structures 1 through 17, and where the substituent Y is the same as defined above for Formula II, and preferably Y is hydrogen or methyl.

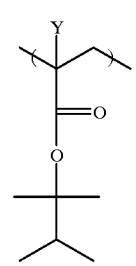

1

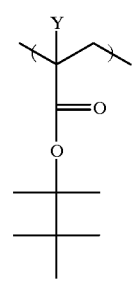

2

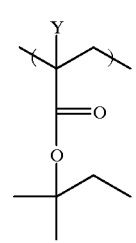

3

4
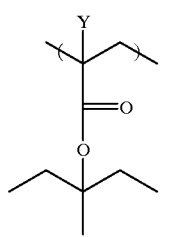
5
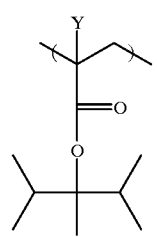
6
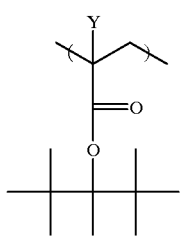
7
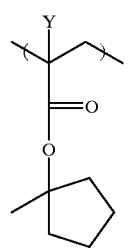
8
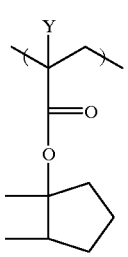
9
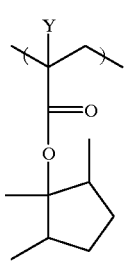
10
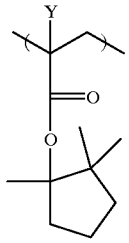
11
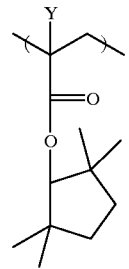
12
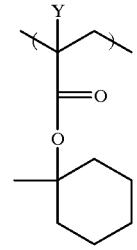
13
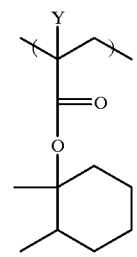
14
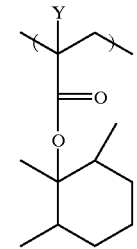
15
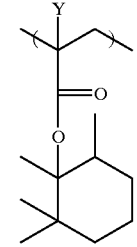

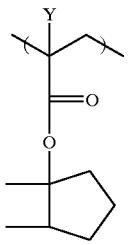

16

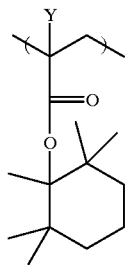

17

The most preferred esters units of polymers of the invention include those of the following structures, and where the substituent Y is the same as that defined above for Formula II, and preferably Y is hydrogen or methyl:

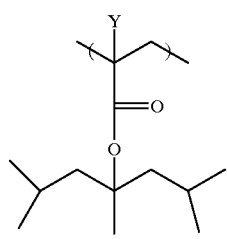

1

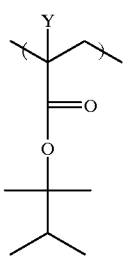

2

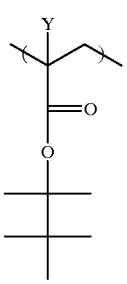

4

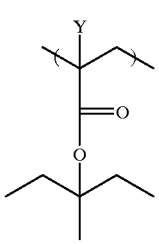

5

Polymers of the invention can be prepared by a variety of methods. One suitable method is free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, ethyl lactate and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed.

Monomers that can be reacted to provide a polymer of the invention can be identified by those skilled in the art. For example, to provide units of Formula I, suitable monomers include e.g. methacrylate or acrylate that contains the appropriate R group substitution on the carboxy oxygen of the ester group. See the examples which follow for exemplary reagents and conditions for synthesis of polymers of the invention.

As discussed, various moieties may be optionally substituted. A "substituted" substituent may be substituted at one or more available positions, typically 1, 2, or 3 positions by one or more suitable groups such as e.g. halogen (particularly F, Cl or Br); $C_{1-8}$ alkyl; $C_{1-8}$ alkoxy; $C_{2-8}$ alkenyl; $C_{2-8}$ alkynyl; hydroxyl; alkanoyl such as a $C_{1-6}$ alkanoyl e.g. acyl and the like; etc.

Polymers also may be formed by modification of preformed resins. For example, a preformed poly(vinylphenol) polymer or copolymer may have appropriate ester units (e.g., via acidic condensation of acrylate monomers) grafted onto the phenolic oxygens. A preferred polymer for such condensation is a copolymer of phenol units and nonaromatic alcohol as disclosed in U.S. Pat. No. 5,128,232 and U.S. Pat. No. 5,340,696 to Thackeray et al.

Preferably a polymer of the invention will have a weight average molecular weight ($M_w$) of 1,000 to about 100,000, more preferably about 2,000 to about 30,000, still more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

Polymers of the invention used in photoresist formulations should contain a sufficient amount of photogenerated acid labile ester groups to enable formation of resist relief images as desired. For instance, suitable amount of such acid labile ester groups will be at least 1 mole percent of total units of the polymer, more preferably about 2 to 50 mole percent, still more typically about 3 to 30 or 40 mole percent of total polymer units. See the examples which follow for exemplary preferred polymers.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 mn and 248 nm imaging include imidosulfonates such as compounds of the following formula:

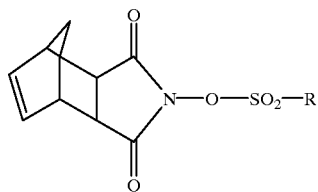

wherein R is camphor, adamantane, alkyl (e.g. $C_{1-2}$ alkyl) and pertluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3 - dicarboximide.

Sulfonate compounds are also suitable PAGs, particularly sulfonate salts. Two suitable agents for 193 nm and 248 nm imaging are the following PAGS 1 and 2:

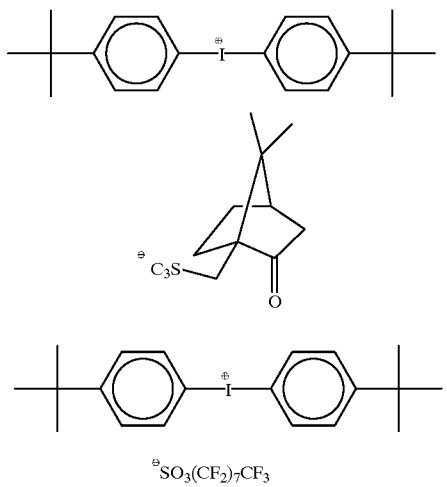

Such sulfonate compounds can be prepared as disclosed in European Patent Application 96118111.2 (publication number 0783136), which details the synthesis of above PAG 1. Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to about 5–10° C. and then camphorsulfonic acid is added followed by neutralization with ammonium hydroxide.

Also suitable are the above two iodonium compounds complexed with anions other than the above-depicted camphorsulfonate groups. In particular, preferred anions include those of the formula $RSO_3$ where R is adamantane, alkyl (e.g. $C_{1-2}$ alkyl) and perfluoroalkyl such as perfluoro ($C_{1-2}$alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether tactate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. Particularly preferred exposure wavelengths include 193 nm and 248 nm. However, the resist compositions of the invention also may be suitably imaged at higher wavelengths. For example, a resin of the invention can be formulated with an appropriate PAG and used as a chemically-amplified positive I-line resist, i.e. a resist imaged at about 365 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLES 1–7

Syntheses of Monomers

Example 1

Synthesis of 2,3-dimethyl-2-butyl methacrylate

Into a 500 mL flask containing a stir bar, and fitted with a condenser, was placed 180 g of anhydrous tetrahydrofuran, 40 g of 2,3-dimethyl-2-butanol and 40.93 g of triethylamine under a $N_2$ atmosphere. To this was dropwise added 40.927 g of purified methacroyl chloride from an addition funnel. Reaction was allowed to warm moderately. After 24 hrs of stirring, the tetrahydrofuran was roto-evaporated from the solution and 100 mL of ethyl acetate was added. The salts were then filtered off though a Buchner funnel. The ethyl acetate was then stripped by use of a rotory-evaporator. A vacuum distillation column was set up with an 8 inch Vigreaux column, stir bar and a few small boiling chips. A fractional distillation was performed and 19.8 g of the product was recovered in the fraction which had a boiling point of approximately 80–87° C. at 6–7 Torr of pressure. $^1$H NMR was used to confirm structure and purity.

Example 2

Synthesis of 2,3,3-trimethyl-2-butyl methacrylate

In a 1 L flask containing a stir bar, and fitted with a condenser under an inert $N_2$ atmosphere was placed 300 mL of 1.4M methyl lithium in diethyl ether. In an addition funnel was placed 41.65 g of pinacolone and 70 mL of anhydrous tetrahydrofuran. The pinacolone was added over a 25 minute period while maintaining a vigorous reflux. The solution was stirred an additional 3 hours at room temperature. Then 43.47 g of methacroyl chloride and 75 mL of anhydrous tetrahydrofuran were placed into an addition funnel and slowly added to the solution while maintaining a vigorous reflux. The solution was then stirred for an additional 12 hours at room temperature. Then the diethyl ether was distilled from the solution until the boiling point reached 50° C. The solution was then refluxed an additional 1 hour, and thereafter the solvents were removed by low-pressure rotary-evaporation and 150 mL of hexane was added. The salts were then filtered off in a Buchner funnel, and the hexane was removed by rotary evaporation. 100 mL of hexane was added and stirred. The solution was then passed through 4 inches of silica gel/hexane and recovered to give a clear effluent. The solvent was removed and 2 mg of hydroquinone was added to the crude monomer. A low-pressure distillation apparatus fitted with an 8 inch Vigreaux fractionating column was used for purification. 39.52 g of the product was recovered in the fraction with a boiling point of 75° C. at 2 Torr pressure. $^1$H NMR was used to confirm structure and purity.

Example 3

Synthesis of 1,2-dimethyl-1-cyclopentyl methacrylate

A procedure very similar to Example 2 was followed, except that 2-methylcyclopentanone was used as a starting material. From the final distillation step, 20.3 g of the product was recovered in the fraction having boiling point of 57° C. at 20 mTorr. $^1$H NMR was used to confirm structure and purity. Product was a 60:40 mixture of two positional isomers, assumed to be cis and trans.

Example 4

Synthesis of 3-methyl-3-pentyl methacrylate

A procedure very similar to Example 1 was followed, except that 3-methyl-3-pentanol was used as the starting material. From the final distillation step, 15.5 g of the product was recovered in the fraction having boiling point of 72° C. at 6 Torr. $^1$H NMR was used to confirm structure and purity.

Example 5

Synthesis of 2,3,4-trimethyl-3-pentyl methacrylate

A procedure very similar to Example 2 was followed, except that 2,4-dimethyl-3-pentanone was used as a starting material. From the final distillation step, 42.3 g of the product was recovered in the fraction having boiling point of 44–47° C. at 100 mTorr. $^1$H NMR was used to confirm structure and purity.

Example 6

Synthesis of 2,2,3,4,4-pentamethyl-3-pentyl methacrylate

A procedure very similar to example 2 was followed, except that 2,2,4,4-tetramethyl-3-pentanone was used as the starting material. The organic layer was washed with water and was found to be 99% pure at that point, giving a 41% yield. $^1$H NMR was used to confirm structure and purity.

Example 7
Synthesis of 1-methylcyclopentyl methacrylate

A procedure very similar to Example 1 was followed, except that 1-methylcyclopentanol was used as a starting material. The product was found to distill at 110–120° C. at 10–15 Torr, to give a 59% yield. $^1$H NMR was used to confirm structure and purity.

Examples 8–22

Synthesis of Polymers

Example 8
Comparison polymer Containing the Prior-art t-butyl methacrylate monomer A polymer with a molar feed ratio of 31:22:10:14:23 of isobornyl methacrylate, tert-butyl methacrylate, methacrylic acid, methacrylonitrile and itaconic anhydride was prepared by the following procedure: Into a 500 mL flask was placed 12.54 g of itaconic anhydride, 15.20 g of tert-butyl methacrylate, 4.58 g of methacrylonitrile, 4.28 g of methacrylic acid, 33.57 g of isobornyl methacrylate and 100 mL of anhydrous tetrahydrofuran. All reagents were at least 99% pure. The flask was fitted with a magnetic stirring bar, a condenser and an addition funnel. All ingredients were sparged with $N_2$ gas for 20 minutes prior to reaction. In the condenser was placed 0.75 g of Vazo 52 free-radical initiator and 25 mL of anhydrous tetrahydrofuran. The solution was heated to 70° C., and the initiator was added over a 20 minute period. The flask was maintained at 70° C. for 14 hours, and then cooled to room temperature. Polymer was obtained by precipitation into 3 L of hexane and drying in a Buchner funnel. Then the polymer was re-dissolved into 120 mL of acetone, reprecipitated into 3 L of hexane and collected on a Buchner funnel. The polymer was dried overnight in a vacuum oven at room temperature. Yield was 49.96 g (66%).

Synthesis Examples 9–21

These polymers were prepared following essentially the same procedure as Example 8 except that the weights of the monomer feeds were adjusted accordingly to achieve the desired mole ratios stated in Table 1. Monomer purities were >99%. Typical polymer yields following isolation were 66–72%.

Table 1 below describes the mole ratios of the monomer feeds for Examples 9–22. In examples 9–21, the stated mole ratios for the monomers are in the order of isobornyl methacrylate:X:methacrylic acid: methacrylonitrile: itaconic anhydride, where X is the monomer being studied. In example 22, the stated mole ratios for the monomers are in the order of 2-methyl-2-adamantyl methacrylate:X:methacrylic acid:methacrylonitrile: itaconic anhydride.

TABLE 1

| Example No. | Monomer X | Molar Feed Ratio |
|---|---|---|
| Comp. Ex. 8 | tert-butyl methacrylate | 31:22:10:14:23 |
| Comp. Ex. 9 | tert-butyl methacrylate | 31:27:10:14:18 |
| Comp. Ex. 10 | tert-butyl methacrylate | 31:33:10:14:12 |
| 11 | 1-methylcyclopentyl methacrylate | 31:22:10:14:23 |
| 12 | 1-methylcyclopentyl methacrylate | 30:40:0:10:20 |
| 13 | 2,3-dimethyl-2-butyl methacrylate | 31:22:10:14:23 |
| 14 | 2,3-dimethyl-2-butyl methacrylate | 28:25:10:14:23 |
| 15 | 2,3-dimethyl-2-butyl methacrylate | 25:28:10:14:23 |
| 16 | 3-methyl-3-pentyl methacrylate | 31:22:10:14:23 |

TABLE 1-continued

| Example No. | Monomer X | Molar Feed Ratio |
|---|---|---|
| 17 | 2,3,3-trimethyl-3-butyl methacrylate | 33:21:10:14:23 |
| 18 | 1,2-dimethyl-cyclopentyl methacrylate | 31:22:10:16:23 |
| 19 | 2,3,4-trimethyl-3-pentyl methacrylate | 31:22:10:14:23 |
| 20 | 2,2,3,4,4-pentamethyl-3-pentyl methacrylate | 31:22:10:14:23 |
| 21 | 2,3-dimethyl-2-butyl methacrylate | 38:22:10:7:23 |

Examples 22–36

Resist Compositions

Example 22
Comparison high-performance resist made from polymer containing t-butyl methacrylate monomer A photoresist composition suitable for lithographic testing was prepared by dissolving 0.525 g of norbornene dicarboximide perfluoroactanesulphonate, MDTPFOS, (obtained from Daychem Corp., U.S.A.), 0.0045 g of 1,8-diazabicyclo [5.4.0]undec-7-ene (Aldrich Corp, U.S.A.), 0.0075 g of Silwet 7604 (Dow Corning Co., U.S.A.) and 6.963 g of the polymer of Example 8 above into 43.5 g of propyleneglycol methyl ether acetate (Dow Corp., U.S.A.). After dissolution, the resist composition was filtered through either a 0.1 μm or 0.2 μm Teflon filter into a clean bottle.

Examples 23

These resist composition were prepared in a manner similar to that described in example 22, except that the choice and amounts of materials used are that described in Table 2. DTBIPFOS refers to bis(4-tert-butylphenyl) iodonium perfluorooctane sulphonate (obtained from Daychem Corp, U.S.A.) and MDTTf refers to norbornene dicarboximide trifluromethane sulphonate (obtained from Daychem Corp, U.S.A.). To aid in dissolving DTBIPFOS, this material was added to the resist composition as a 5% solution in ethyl lactate. In resist compositions except examples 22–26 and 28–35, the following components were present in the following amounts: 0.0045 g of 1,8-diazabicyclo[5.4.0]undec-7-ene (Aldrich Corp, U.S.A.), 0.0075 g of Silwet 7604 (Dow Corning Co., U.S.A.) and into 43.5 g of propyleneglycol methyl ether acetate (Dow Corp., U.S.A.). In example 27, the following components were present in the following amounts: 0.0068 g of Proton Sponge (Aldrich Corp, U.S.A.), 0.0075 g of Silwet 7604 and into 43.5 g of propyleneglycol methyl ether acetate. In example 36, the following components were present in the following amounts: 0.0225 g of 1,8-diazabicyclo[5.4.0]undec-7-ene, 0.0075 g of Silwet and into 43.5 g of propyleneglycol methyl ether acetate.

TABLE 2

Polymers and photoacid generators used in resist compositions. (Weights are given in grams.)

| Example No. | Polymer Example | weight polymer | weight MDTPFOS | weight DTBIPFOS | weight MDTTf |
|---|---|---|---|---|---|
| 22-reference | 8 | 6.963 | 0.525 | 0 | 0 |
| 23-reference | 9 | 6.963 | 0.525 | 0 | 0 |
| 24-reference | 10 | 6.963 | 0.525 | 0 | 0 |
| 25 | 8 | 6.918 | 0.525 | 0.045 | 0 |

TABLE 2-continued

Polymers and photoacid generators used in resist compositions.
(Weights are given in grams.)

| Example No. | Polymer Example | weight polymer | weight MDTPFOS | weight DTBIPFOS | weight MDTTf |
|---|---|---|---|---|---|
| 26 | 11 | 6.963 | 0.525 | 0 | 0 |
| 27 | 12 | 7.111 | 0.375 | 0 | 0 |
| 28 | 13 | 6.963 | 0.525 | 0 | 0 |
| 29 | 14 | 6.918 | 0.525 | 0.045 | 0 |
| 30 | 15 | 6.918 | 0.525 | 0.045 | 0 |
| 31 | 16 | 6.918 | 0.525 | 0.045 | 0 |
| 32 | 17 | 6.918 | 0.525 | 0.045 | 0 |
| 33 | 18 | 6.918 | 0.525 | 0.045 | 0 |
| 34 | 19 | 6.963 | 0.525 | 0 | 0 |
| 35 | 20 | 6.963 | 0.525 | 0 | 0 |
| 36 | 21 | 6.803 | 0.375 | 0.0 | 0.225 |

Examples 37–51

Lithographic Testing of Resist Compositions

The polymers of the invention were lithographically tested. The reference compositions containing polymers which include the monomer tert-butyl methacrylate had been previously carefully optimized both in composition and lithographic process to optimize lithographic performance. Test results exceed the reference compositions' performance would demonstrate quite useful and unexpected success.

In order to assess resolution capability, high-voltage cross-sectional scanning electron microscopic methods were used to examine the printed features. Minimal resolution in an imaged 1:1 pitch grating was assessed by two methods: Method #1—the smallest, essentially full-thickness line which cleanly developed, had a flat top and did not leave residue on the substrate; Method #2—Choosing an exposure dose such that the patterned 1:1 160 nm lines and 160 nm spaces on the mask actually measured 160 nm in size respectively, and then determining the smallest, essentially full-thickness line which cleanly developed, had a flat top and did not leave residue on the substrate. Photospeed is the exposure dose required in Method #2.

The lithographic processing was performed on modern wafer-processing tools (manufactured by FSI and SVG Companies) using both 150 mm and 200 mm silicon wafers. All processing was done in an essentially base-contaminant free atmosphere (<5 ppb measure amines/ammonia). The wafers were coated with an organic anti-relective film prior to subsequent processing. The photoresist was spun onto the wafers at about 3000 rpm and baked (PAB, post-apply bake) on a 150 μm proximity-gap plate and then rapidly cooled to room temperature to give a film thickness of 4200 Å. Then the film was exposed using a resolution-test pattern on a GCA 0.60 NA ArF (193 nm) wafer stepper at a partial coherence setting of 0.70. Immediately afterwards, the film was baked (PEB, post-exposure bake) on a 150 μm proximity-gap plate, and then rapidly cooled to room temperature. Immediately afterwards the film was developed using an industry-standard 60 second track-single-puddle process with industry standard 0.26 N tetramethylammonium hydroxide developer.

Because different ester leaving groups in the polymers of this invention have different activation energies and reactivities to the photo-generated acid in the film, in most cases the PAB and PEB temperatures were varied to find an independent set of bake process conditions which yields good resolution performance for each individual resist composition. In this manner, performance comparisons could show the lithographic capability of each composition, independent of the bake conditions. These results are shown in Table 3 below.

TABLE 3

Results from lithographic testing of the resist compositions of examples. Es refers to the energy to size 1:1 160 nm lines:spaces, ResL refers to the resolution at Es, and ResU refers to the ultimate resolution with overexposure. PAB and PEB are given in units of ° C., Es is in units of mJ/cm$^2$, and ResL and ResU are in units of nm.

| Example | Composition | PAB | PEB | Es | ResL | ResU | Comments |
|---|---|---|---|---|---|---|---|
| 37-reference | 22 | 140 | 155 | 28 | 150 | 140 | fair profiles |
| 38-reference | 23 | 140 | 155 | 31 | 160 | 160 | microbridges |
| 39-reference | 24 | 140 | 155 | 30 | 160 | 160 | microbridges |
| 40 | 25 | 140 | 155 | 27 | 140 | 140 | fair profiles |
| 41 | 26 | 140 | 155 | 37 | 150 | 140 | fair profiles |
| 42 | 27 | 140 | 150 | 57 | 170 | 160 | microbridges |
| 43 | 28 | 140 | 150 | 31 | 140 | 130 | good profiles |
| 44 | 29 | 140 | 150 | 24 | 140 | 130 | good profiles |
| 45 | 30 | 140 | 150 | 24 | 135 | <130 | good profiles |
| 46 | 31 | 140 | 150 | 26 | 140 | <140 | good profiles |
| 47 | 32 | 140 | 130 | 29 | 140 | 130 | |
| 48 | 33 | 130 | 140 | 29 | 140 | 130 | good profiles |
| 49 | 34 | 125 | 125 | 18 | 160 | 150 | |
| 50 | 35 | 135 | 125 | 20 | 160 | 160 | |
| 51 | 36 | 135 | 130 | 30 | 140 | 140 | good profiles |

The resist compositions of the invention can yield remarkably high-performance photoresists suitable for semiconductor manufacturing applications. The resolution capability of the resist compositions of this invention equals, and in many cases exceeds, the resolution capability of the reference resist compositions 37–39. In particular, resist compositions 40, 43–48 and 51 show better linear resolution (ResU) than the reference composition 37. Good performance in ResL is very important to semiconductor device manufacturing because it means that the mask used does not need to be "biased" to correctly size the linewidths of different 1:1 pitch features. This can simplify the manufacturing process and reduce the cost of the masks. Resist compositions evaluated in examples 43–48 also show better ultimate resolution (ResU) than the reference compositions evaluated in examples 37–39. This is a key performance criteria which indicates, that if necessary, finer pattern geometries can be obtained with this invention. Many of the lithographic examples of this invention also show more desirable imaged photoresist profiles than the reference compositions 37–39: steeper wall angles, flatter tops, less "flaring" at the resist/substrate interface. Improved profile shape is useful for semiconductor manufacturing in two ways: improved metrological testing reliability and in maintaining pattern fidelity during plasma-etch processing steps.

The examples 44–46 show that compositions 29–31 show improved performed to the reference compositions 37–39 in all evaluated criteria, including with respect to photospeed. That combination of improvements is unexpected and commercially useful.

The foregoing description of the invention is merely illustrative thereof, and it is understood that variations and modification can be made without departing from the spirit or scope of the invention as set forth in the following claims.

What is claimed is:

1. A photoresist composition comprising:
   (i) a photoactive component, and
   (ii) a polymer that comprises ester groups,
   wherein each ester group has carbonyl and carboxyl oxygen atoms and comprises an optionally substituted noncyclic alkyl moiety having 6 or more carbon atoms, with at least two secondary, tertiary or quaternary carbon atoms, and wherein the ester carboxyl group is directly bonded to a quaternary carbon atom.

2. The photoresist composition of claim 1 wherein the alkyl moiety comprises at least one tertiary carbon atom.

3. The photoresist composition of claim 1 wherein the alkyl moiety comprises two or more tertiary carbon atoms.

4. The photoresist composition of claim 1 wherein the alkyl moiety has up to 12 carbon atoms.

5. The photoresist composition of claim 1 wherein the ester group is directly pendant from the polymer backbone.

6. The photoresist composition of claim 1 wherein the ester group is provided by an acrylate or methacrylate group.

7. The photoresist composition of claim 1 wherein the alkyl moiety is substituted only by alkyl groups.

8. The photoresist composition of claim 1 wherein the polymer comprises units of the following Formula I:

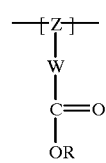

I wherein W is a linker group;

wherein R is noncyclic allyl moiety having 6 or more carbon atoms, with at least two secondary tertiary or quaternary carbon atoms; and Z is a bridge group between polymer units.

9. The photoresist composition of claim 1 wherein the polymer comprises units of the following Formula II:

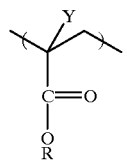

II wherein R is noncyclic alkyl moiety having 6 or more carbon atoms, with at least two secondary, tertiary or quaternary carbon atoms;

Y is hydrogen or $C_{1-6}$ alkyl.

10. The photoresist composition of claim 1 wherein Y is hydrogen or methyl.

11. The photoresist composition of claim 1 wherein the polymer further comprises aromatic groups.

12. The photoresist composition of claim 1 wherein the polymer further comprises optionally substituted phenyl groups.

13. The photoresist composition of claim 1 wherein the polymer comprises less than about 1 mole percent of aromatic groups.

14. The photoresist composition of claim 1 wherein the polymer is completely free of aromatic groups.

15. The photoresist of claim 1 wherein the photoactive component is a photoacid generator compound that is activated by radiation having a wavelength of about 248 nm or about 193 nm.

16. The photoresist composition of claim 1 wherein the polymer comprises one or more of the following units:

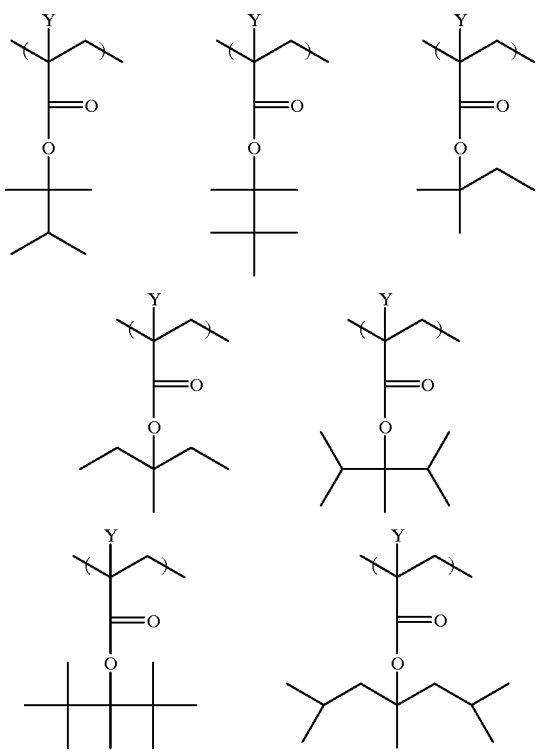

wherein each Y is independently hydrogen or $C_{1-4}$ alkyl.

17. The photoresist composition of claim 16 wherein each Y is independently hydrogen or methyl.

18. The photoresist composition of claim 1 wherein the polymer comprises one or more of the following units:

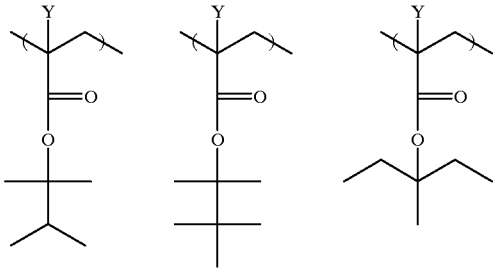

wherein each Y is independently hydrogen or $C_{1-6}$ alkyl.

19. The phororesist composition of claim 18 wherein each Y is independently hydrogen or methyl.

20. A method of forming a positive photoresist relief image, comprising:

(a) applying a coating layer of a photoresist composition on a substrate, the photoresist composition comprising:

(i) a photoactive component, and (ii) a polymer that comprises an ester repeating unit, wherein the ester group has carbonyl and carboxyl oxygen atoms and comprises an optionally substituted noncyclic alkyl moiety having 6 or more carbon atoms, with at least two secondary, tertiary or quaternary carbon atoms, and wherein the ester carboxyl group is directly bonded to a quaternary carbon atom; and (b) exposing and developing the photoresist layer to yield a relief image.

21. The method of claim 20 wherein the photoresist layer is exposed with radiation having a wavelength of about 193 mm.

22. The method of claim 20 wherein the photoresist layer is exposed with radiation having a wavelength of about 248 nmn.

23. The method of claim 20 wherein the photoresist layer is exposed with radiation having a wavelength of about 365 mn.

24. The method of claim 20 wherein the polymer further comprises aromatic groups.

25. The method of claim 20 wherein the polymer comprises less than about 1 mole percent of aromatic groups.

26. The method of claim 20 wherein the polymer is completely free of aromatic groups.

27. The method of claim 20 wherein the polymer comprises one or more of the following units.

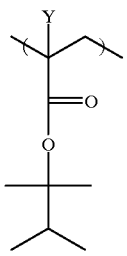 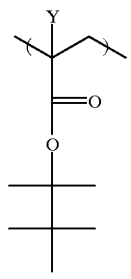 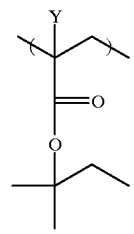

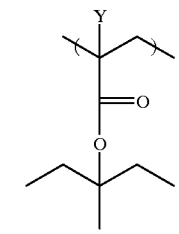 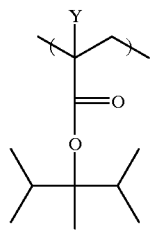

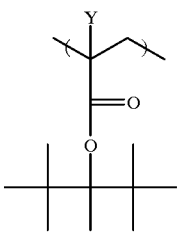 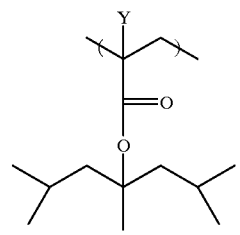

wherein each Y is independently hydrogen or $C_{1-6}$ alkyl.

28. The method of claim 27 wherein each Y is independently hydrogen or methyl.

29. The method of claim 20 wherein the polymer comprises one or more of the following units.

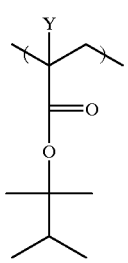 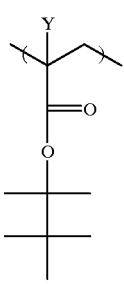 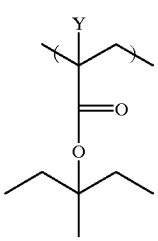

wherein each Y is independently hydrogen or $C_{1-6}$ alkyl.

30. The method of claim 29 wherein each Y is independently hydrogen or methyl.

* * * * *